BEST AVAILABLE COPY

Oct. 9, 1923. Re. 15,697

R. F. SCHUCHARDT

METER

Original Filed Nov. 29, 1918 7 Sheets-Sheet 1

Inventor:
Rudolph Frederick Schuchardt
by Alexander S. Lanier
His Attorney.

BEST AVAILABLE COPY

Oct. 9, 1923.

Re. 15,697

R. F. SCHUCHARDT

METER

Original Filed Nov. 29, 1918 7 Sheets-Sheet 2

Inventor:
Rudolph Frederick Schuchardt
by Alexander S. Lane
His Attorney.

BEST AVAILABLE COP'

Oct. 9, 1923 Re. 15,697

R. F. SCHUCHARDT

METER

Original Filed Nov. 29, 1918 7 Sheets-Sheet 3

Inventor:
Rudolph Frederick Schuchardt
by Alexander S. Kent
His Attorney.

BEST AVAILABLE COP'

Oct. 9, 1923.

Re. 15,697

R. F. SCHUCHARDT

METER

Original Filed Nov. 29, 1918 7 Sheets-Sheet 4

Inventor:
Rudolph Frederick Schuchardt,
by Alexander S. Lunt.
His Attorney.

BEST AVAILABLE COP'
Oct. 9, 1923. Re. 15,697
R. F. SCHUCHARDT
METER
Original Filed Nov. 29, 1918 7 Sheets-Sheet 5
Fig. 7.
| 9 | 8 | 7 | 6 | 5 | 4 | 3 | 2 | 1 | | |
|---|---|---|---|---|---|---|---|---|---|---|
| 0 | 0 | 0 | 0 | 0 | 0 | 0 | 0 | 0 | X | |
| 11.0 | 12.3 | 14.1 | 16.5 | 19.4 | 24.1 | 31.7 | 44.6 | 70.7 | 100 | 1 |
| 21.6 | 24.1 | 27.3 | 31.7 | 37.2 | 44.6 | 55.4 | 70.7 | 89.4 | 100 | 2 |
| 31.7 | 35.0 | 39.4 | 44.6 | 51.5 | 59.9 | 70.7 | 83.2 | 94.9 | 100 | 3 |
| 40.5 | 44.6 | 49.5 | 55.4 | 62.4 | 70.7 | 80.0 | 89.4 | 97.0 | 100 | 4 |
| 48.6 | 53.0 | 58.1 | 64.0 | 70.7 | 78.1 | 85.7 | 92.8 | 98.1 | 100 | 5 |
| 55.5 | 60.8 | 65.1 | 70.7 | 76.8 | 83.2 | 89.4 | 94.9 | 98.6 | 100 | 6 |
| 61.3 | 65.9 | 70.7 | 75.9 | 81.3 | 86.8 | 91.9 | 96.2 | 99.0 | 100 | 7 |
| 66.4 | 70.7 | 75.2 | 80.0 | 84.8 | 89.4 | 93.6 | 97.0 | 99.2 | 100 | 8 |
| 70.7 | 74.7 | 78.9 | 83.2 | 87.4 | 91.4 | 94.9 | 97.6 | 99.4 | 100 | 9 |
Fig. 8.
| | | | | | | | | | | |
|---|---|---|---|---|---|---|---|---|---|---|
| 10 | 9 | 8 | 7 | 6 | 5 | 4 | 3 | 2 | 1 | 0 |
| 0 | 0 | 0 | 0 | 0 | 0 | 0 | 0 | 0 | 0 | 0 |
| 0 | 0 | 0 | 0 | 0 | 0 | 0 | 0 | 0 | 0 | X |
| 10 | 9 | 8 | 7 | 6 | 5 | 4 | 3 | 2 | 1 | 0 |
| 1 | 1 | 1 | 1 | 1 | 1 | 1 | 1 | 1 | 1 | 1 |
| 9.8 | 11.0 | 12.3 | 14.1 | 16.5 | 19.4 | 24.1 | 31.7 | 44.6 | 70.7 | 100 |
| 10 | 9 | 8 | 7 | 6 | 5 | 4 | 3 | 2 | 1 | 0 |
| 2 | 2 | 2 | 2 | 2 | 2 | 2 | 2 | 2 | 2 | 2 |
| 19.4 | 21.6 | 24.1 | 27.3 | 31.7 | 37.2 | 44.6 | 55.4 | 70.7 | 83.4 | 100 |
| 10 | 9 | 8 | 7 | 6 | 5 | 4 | 3 | 2 | 1 | 0 |
| 3 | 3 | 3 | 3 | 3 | 3 | 3 | 3 | 3 | 3 | 3 |
| 28.7 | 31.7 | 35.0 | 39.4 | 44.6 | 51.5 | 59.9 | 70.7 | 83.2 | 94.9 | 100 |
| 10 | 9 | 8 | 7 | 6 | 5 | 4 | 3 | 2 | 1 | 0 |
| 4 | 4 | 4 | 4 | 4 | 4 | 4 | 4 | 4 | 4 | 4 |
| 37.2 | 40.5 | 44.6 | 49.5 | 55.4 | 62.4 | 70.7 | 80.0 | 89.4 | 97.0 | 100 |
| 10 | 9 | 8 | 7 | 6 | 5 | 4 | 3 | 2 | 1 | 0 |
| 5 | 5 | 5 | 5 | 5 | 5 | 5 | 5 | 5 | 5 | 5 |
| 44.6 | 48.5 | 53.0 | 58.0 | 63.9 | 70.7 | 78.0 | 85.7 | 92.8 | 98.0 | 100 |
| 10 | 9 | 8 | 7 | 6 | 5 | 4 | 3 | 2 | 1 | 0 |
| 6 | 6 | 6 | 6 | 6 | 6 | 6 | 6 | 6 | 6 | 6 |
| 51.5 | 55.4 | 59.9 | 65.1 | 70.7 | 76.8 | 83.2 | 89.4 | 94.9 | 98.6 | 100 |
| 10 | 9 | 8 | 7 | 6 | 5 | 4 | 3 | 2 | 1 | 0 |
| 7 | 7 | 7 | 7 | 7 | 7 | 7 | 7 | 7 | 7 | 7 |
| 57.3 | 61.3 | 65.9 | 70.7 | 75.9 | 81.3 | 86.8 | 91.9 | 96.2 | 99.0 | 100 |
| 10 | 9 | 8 | 7 | 6 | 5 | 4 | 3 | 2 | 1 | 0 |
| 8 | 8 | 8 | 8 | 8 | 8 | 8 | 8 | 8 | 8 | 8 |
| 62.4 | 66.4 | 70.7 | 75.2 | 80.0 | 84.8 | 89.4 | 93.6 | 97.0 | 99.2 | 100 |
| 10 | 9 | 8 | 7 | 6 | 5 | 4 | 3 | 2 | 1 | 0 |
| 9 | 9 | 9 | 9 | 9 | 9 | 9 | 9 | 9 | 9 | 9 |
| 66.9 | 70.7 | 74.7 | 78.9 | 83.2 | 87.4 | 91.4 | 94.9 | 98.1 | 99.4 | 100 |
Fig. 9.
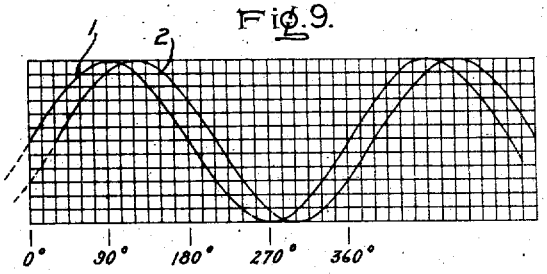
Fig. 10.
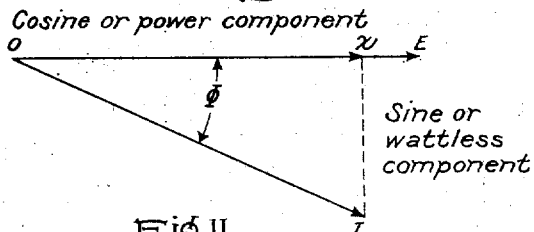
Fig. 11.
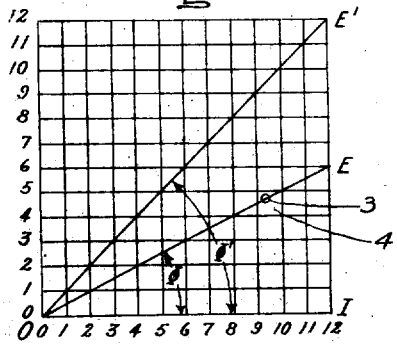
Fig. 8a.
| | | | | | | | | | |
|---|---|---|---|---|---|---|---|---|---|
| | | | | | | 78.0 | 85.7 | 92.8 | 98.0 | 100 |
| 9 | 8 | 7 | 6 | 5 | 4 | 3 | 2 | 1 | 0 | |
| 6 | 6 | 6 | 6 | 6 | 6 | 6 | 6 | 6 | 6 | |
| 55.4 | 59.9 | 65.1 | 70.7 | 76.8 | 83.2 | 89.4 | 94.9 | 98.6 | 100 | |
| 9 | 8 | 7 | 6 | 5 | 4 | 3 | 2 | 1 | 0 | |
| 7 | 7 | 7 | 7 | 7 | 7 | 7 | 7 | 7 | 7 | |
| 61.3 | 65.9 | 70.7 | 75.9 | 81.3 | 86.8 | 91.9 | 96.2 | 99.0 | 100 | |
Inventor:
Rudolph Frederick Schuchardt,
by Alexander S. Trust,
His Attorney.

BEST AVAILABLE COPY

Oct. 9, 1923

Re. 15,697

R. F. SCHUCHARDT

METER

Original Filed Nov. 29, 1918 7 Sheets-Sheet 6

Inventor:
Rudolph Frederick Schuchardt
by Alexander S. Lane
His Attorney.

BEST AVAILABLE COP'

Oct. 9, 1923.

Re. 15,697

R. F. SCHUCHARDT

METER

Original Filed Nov. 29, 1918 7 Sheets-Sheet 7

Inventor:
Rudolph Frederick Schuchardt
by Alexander S. Lunt
His Attorney.

BEST AVAILABLE COPY

Reissued Oct. 9, 1923. Re. 15,697

UNITED STATES PATENT OFFICE.

RUDOLPH F. SCHUCHARDT, OF CHICAGO, ILLINOIS, ASSIGNOR TO GENERAL ELECTRIC COMPANY, A CORPORATION OF NEW YORK.

METER.

Original No. 1,366,960, dated February 1, 1921, Serial No. 264.533, filed November 29, 1918. Application for reissue filed May 3, 1923. Serial No. 636,451.

*To all whom it may concern:*

Be it known that I, RUDOLPH FREDERICK SCHUCHARDT, a citizen of the United States, residing at Chicago, in the county of Cook and State of Illinois, have invented a certain new and useful Improvement in Meters, of which the following is a full, clear, concise, and exact description, reference being had to the accompanying drawings, forming a part of this specification.

My invention relates to meters, and particularly to means for indicating and recording the power factor of a customer's load, and for indicating and recording other characteristics of the same.

The character of the load, particularly with respect to power factor, connected to the generating system is of importance in fixing rates charged for power and in determining the design of the circuits.

Electric current has, among other properties, two important manifestations which are most commonly put to use for industrial purposes, namely, the development of heat and the development of magnetic effect.

For power purposes and for transformation of current the magnetic effect is more important and for lighting, welding and the like the heat effect is more important. Neither can be developed purely without some manifestation of the other, but it is easily possible to develop either one with a substantial absence of the other.

It is well known to those skilled in the art that the creation or increase of a magnetic flow or field is attended with a certain delay which is comparable with an effect of inertia and similarly the destruction or diminution of the magnetic flow or field is attended with a certain delay also comparable with the effect of inertia. Hence in the case of the employment of the magnetic effect of alternating current for transformation or power purposes there is a tendency for the electrical energy to be less effective due to this lag of the desired magnetic effect behind the force or pressure tending to create it.

One complete cycle of an alternating current wave is considered the same as a complete mechanical revolution of 360° and a half cycle the same as 180° of movement. The amount of lag of one quantity namely current behind, the other namely electromotive force, is stated in terms of degrees. Where this wave shape has the form of simple harmonic motion known as the sine wave, then mathematically the cosine of the angle by which the current lags behind the electromotive force, measured as above described in degrees is a measure of the actual reduction in positive power factor due to the fact that the current lags behind the electromotive force. Technically the cosine of this angle is termed the power factor. It will be seen that power factor is a measure of the effectiveness of the actual electrical energy applied.

The power factor of a piece of transforming or power developing apparatus is largely controlled by the nature of the design and the character of the use of said apparatus. The effectiveness of the apparatus at the central station for generating and transmitting power is decreased by a load apparatus operating at a power factor less than unity. Consequently it is apparent that a consumer using a certain amount of power at a power factor less than unity actually employs a greater portion of the generating and transmitting apparatus than does a consumer using the same amount of power at unity power factor. The customer or consumer should therefore be charged for the power used upon a basis which takes into account the power factor of his load.

There is a strong demand in the art for some means which will enable the central station and the consumer to know at all times the power factor of the load and to keep a record such as can be consulted for designing circuits, laying out new installations, applying corrective means, and for general information. In some classes of work such as steel furnace operation, it is desirable to maintain a certain value of power factor to secure proper and efficient operation. For such work a device of the present character is necessary in order to maintain the desired power factor and for observing and recording the working of the apparatus. Where synchronous apparatus is employed for power development transformation or for power factor correction there has long been a demand for a device of this character for indicating and recording the operation of the apparatus.

Heretofore it has been customary in the

BEST AVAILABLE COPY above connection to make tests at relatively long intervals to determine the power factor of the consumer's load and to make rates upon that basis. This has not been satisfactory because it is not a true measure of the actual power factor nor is it a reliable approximation.

Such measurement further fails to give the value of the power factor at peak loads, and this it is very desirable to know.

According to my invention I provide among other things means for automatically indicating and recording at short intervals the approximate power factor over that period. I also provide in conjunction with the above, means for indicating and recording the total power component and the total reactive component of the load over the same period.

The theory of my invention and the relation it bears to the electrical quantities involved may be demonstrated mathematically as follows:

The instantaneous value of power factor is the cosine of the angle of lag of the current behind the electro-motive force at that instant. Or it may be otherwise stated as the cosine of that angle whose tangent is the ratio of the instantaneous value of the reactive component to the instantaneous value of the energy component.

The power factor and the total amount of power drawn are independent variables as can be seen at once from the equation expressing power:

$$\text{Power} = \text{EI} \cos \phi.$$

I have observed that it would be possible to determine the instantaneous values of power factors which might be represented by the following expression:

$$\frac{d \cos \phi}{dt}$$

by ascertaining the instantaneous value of the power component, which may be represented by the following expression:

$$\frac{\text{E}(di)\ (d \cos \phi)}{dt}$$

and the instantaneous value of the reactive component, which may be represented by the following expression:

$$\frac{\text{E}(di)\ (d \sin \phi)}{dt}$$

inasmuch as the ratio of the reactive component to the power component represents the tangent of the angle of lag whose cosine is the power factor.

This may be expressed in the following equation:

$$d \tan \phi = \frac{\dfrac{\text{E}(di)\ (d \sin \phi)}{dt}}{\dfrac{\text{E}(di)\ (d \cos \phi)}{dt}}$$

It is well known that for every value of the tangent of the angle of lag there is a fixed corresponding value of the cosine which may be mathematically expressed by the following equation:

$$\cos \phi = \frac{1}{\sqrt{1 + \tan^2 \phi}}$$

Whereas the provision of means for automatically indicating the cosine of the angle of lag by means which are responsive respectively to the reactive and the power components of the load constitute the basis of my invention. I have observed that it would be undesirable to record a succession of such instantaneous values and I have therefore provided means for recording the average power factor over a given period of time by adding up or integrating the instantaneous values of the reactive component over the give period and adding up or integrating the instantaneous values of the power component of the load over the same period, and automatically indicating and recording these quantities and the cosine of the angle of which their aforesaid ratio is the tangent.

Considering a period of time running from $t$ to $t_1$ the total reactive component over that period may be represented by the expression:

$$\int_t^{t_1} \frac{\text{E}(di)\ (d \sin \phi)}{dt}$$

and the total power component over the same period may be represented by the expression:

$$\int_t^{t_1} \frac{\text{E}(di)\ (d \cos \phi)}{dt}$$

Hence the average power factor over the same given period may be represented by the expression:

$$\text{Average P. F.} = \cos \phi = \frac{1}{\sqrt{1 + \left( \dfrac{\displaystyle\int_t^{t_1} \frac{\text{E}(di)\ (d \sin \phi)}{dt}}{\displaystyle\int_t^{t_1} \frac{\text{E}(di)\ (d \sin \phi)}{dt}} \right)^2}}$$

BEST AVAILABLE COPY

I have provided means for automatically evaluating the above equations and for producing a record of the same at the end of a period. Preferably such values covering such definite periods are printed in succession on a strip of paper and they may be further integrated, if desired, to arrive at an average power factor for any greater desired period of time.

I may construct the apparatus to be purely indicating in character and I may then omit the recording feature. In either case I provide two electrical integrating devices responsive to the power component and to the reactive component, respectively, and a third element, the position or condition of which is controlled by the two aforesaid devices.

While the invention may be practised in many different forms of apparatus, I shall describe the preferred form and shall point out in the following specification and particularly in the appended claims, the essential features of my invention.

Preferably I employ, in connection with two wattmeters of the integrating type as the responsive elements, a cylinder having means on its face for indicating the power factor in accordance with the axial and rotary position of said cylinder. I cause the cylinder to be moved axially to represent the response of the one wattmeter element to the reactive component and to be moved rotarily to represent the response of the other wattmeter element to the power component. The cylinder may obviously be moved in the opposite relation by the respective wattmeter elements. The surface of the cylinder is divided on rectangular coordinates to provide small rectangular faces or fields upon which are inscribed, or otherwise indicated, the corresponding values of power factor as by suitable numerals or other indicating or recording means. The cylinder may also have indicating or recording means for indicating or recording the value of the power component over said period and of the reactive component over the given period.

Instead of a cylinder, a plane surface or any other surface which may be desired may be provided, and either the surface itself may be moved or two indicating members operating preferably in different directions to each other and having an intersection which constitutes a reference point may be moved across the field to indicate said values. If desired the reference point may be moved in one direction and the chart in another direction. In any event the chart is graduated in two dimensions and relative motion of the chart and the reference point may be secured in any preferred manner.

In the accompanying drawings in which I have illustrated diagrammatically the preferred embodiment of my invention, Figure 1 is a diagrammatic layout of a system embodying my invention for indicating power factor over a given period;

Fig. $5^A$ and Fig. $5^B$ shown as two parts of a system consist of a diagrammatic layout of my invention as applied to a three-phase line and providing means for recording both the reactive component, the power factor and the power component.

Figure 1:
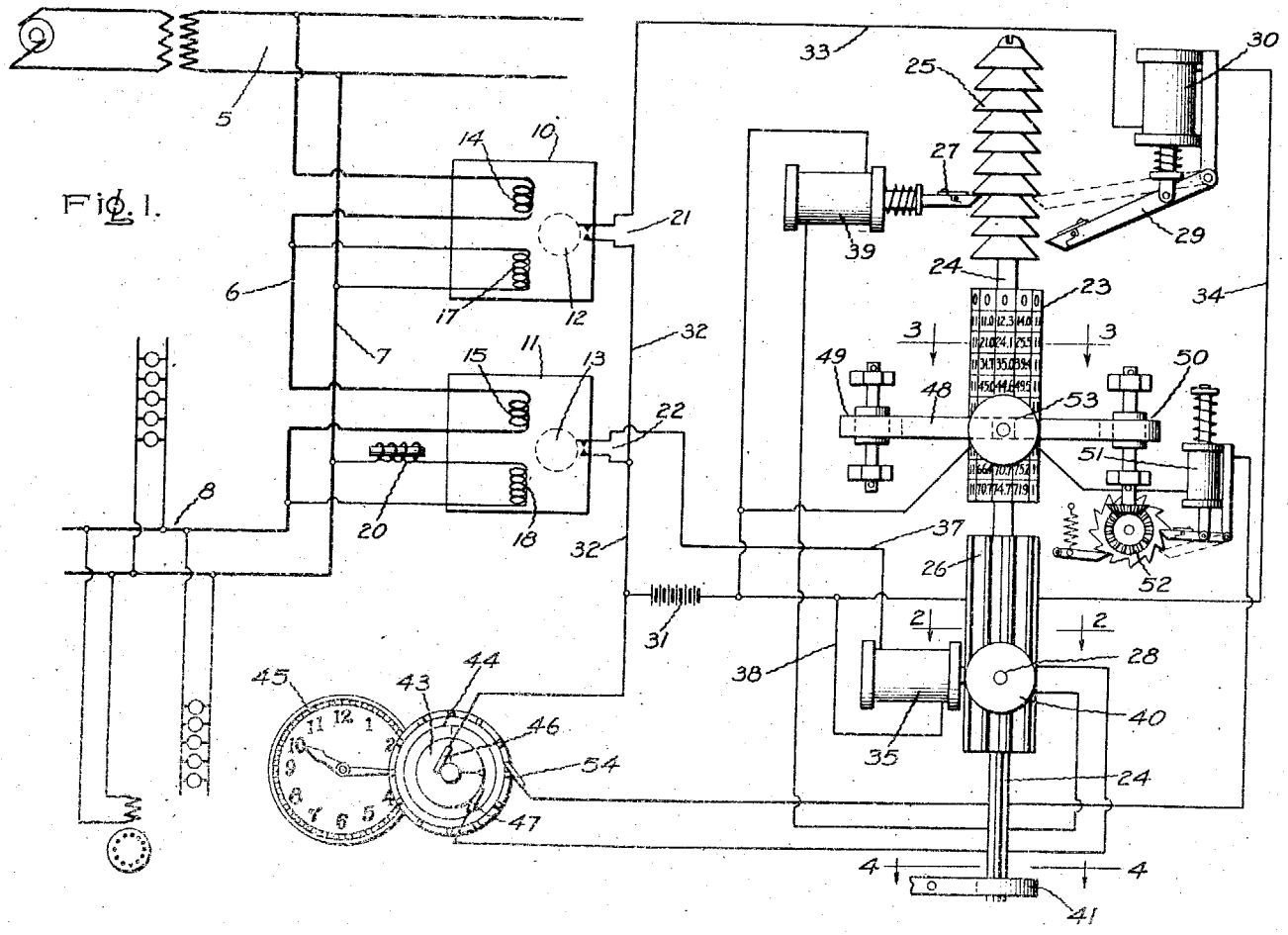
Figure 6:
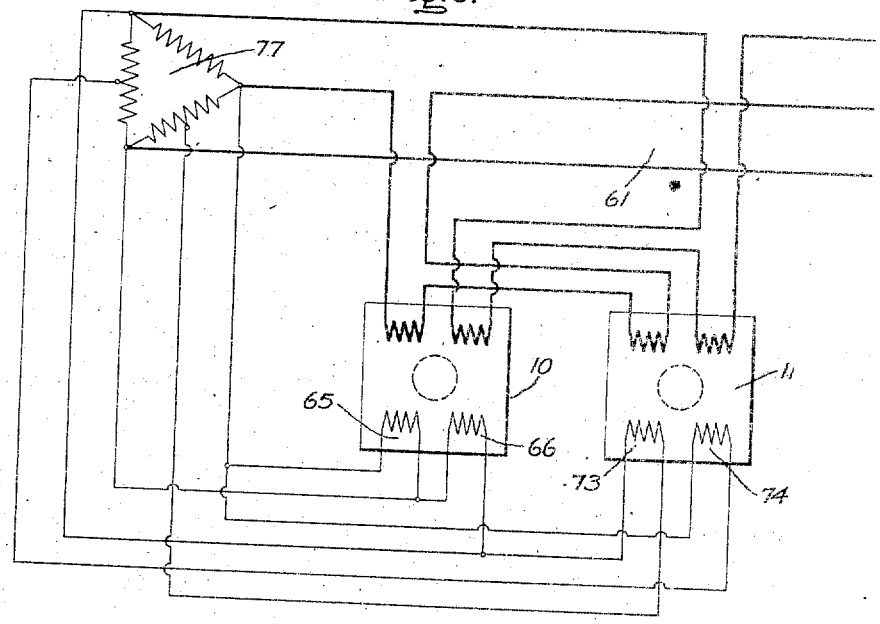
Figure 3:
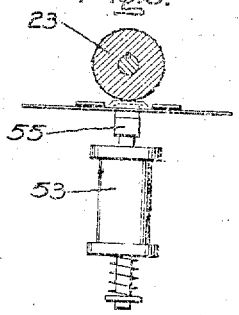
Fig. 3 is a similar view taken on the line 3—3 of Fig. 1.
Figure 2:
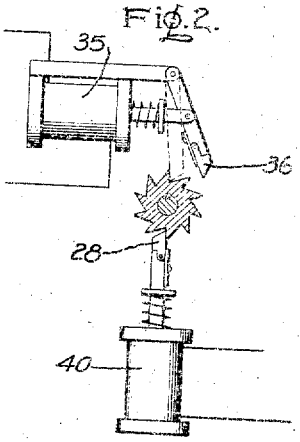
Fig. 2 is a diagrammatic sectional view taken on the line 2—2 of Fig. 1.
Figure 4:
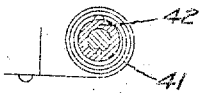
Fig. 4 is a similar view taken on the line 4—4 of Fig. 1.

Fig 6 indicates diagrammatically another form of connection for a 3-phase line;

Fig. 7 is a developed view of the printing cylinder shown in Fig. 1;

Fig. 8 is a developed view of the printing cylinder shown in Fig. $5^B$, and

Figure 12:
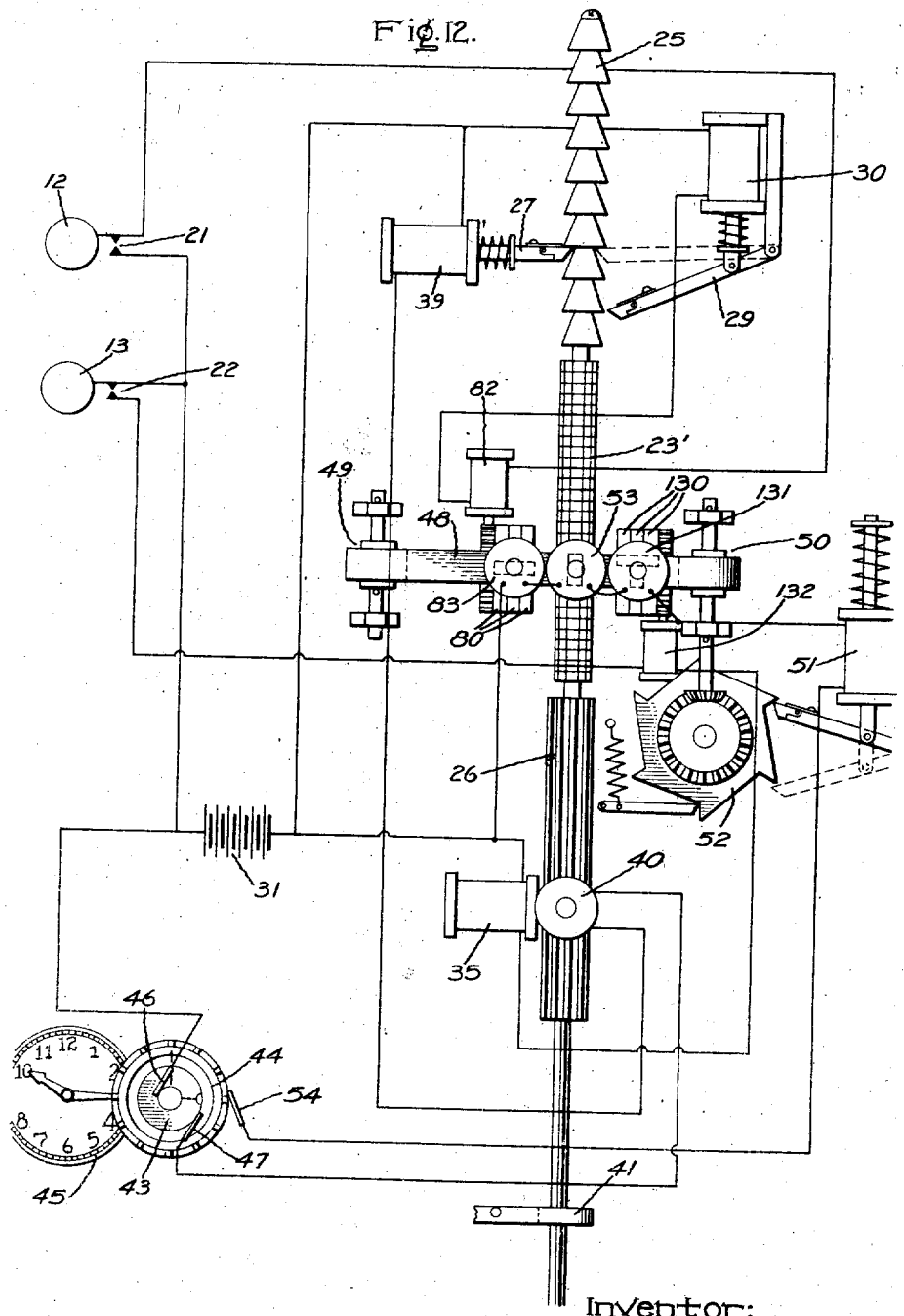
Figure 13:
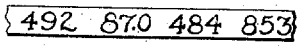
Figure 14:
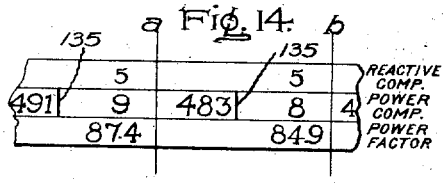

Fig. $8^A$ is a developed view of the printing cylinder shown in Fig. 12;

Figs. 9, 10 and 11 are explanatory diagrams;

Fig. 12 is a diagram of a modification showing means for recording the total power component over a protracted period of time;

Fig. 13 is a fragmentary view of the record made where total power and power factor only are recorded;

Fig. 14 is a similar fragmentary view showing the record made when power factor, reactive component and power component and total kilowatts are recorded.

Figure 15:
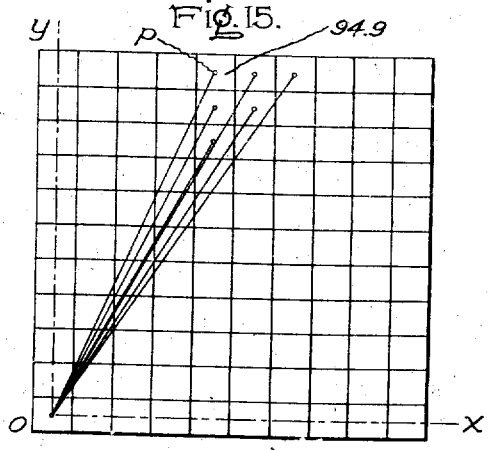

Fig. $14^A$ shows the record made by the device of Fig. 12;

Fig. $14^B$ shows a modification in the form of the strip;

Fig. 15 is a chart or diagram explanatory of the method of arriving at the values of power factor to be placed in the individual squares as indicated in Fig. 7.

Considering first Figs. 9 to 12 inclusive, I shall explain briefly the theoretical nature of the printing chart.

In alternating current the relation between the electro-motive force and the flow of current broadly may be represented by the curves shown in Fig. 9. The curve 1 which represents the electro-motive force, is shown in this case as leading the curve 2, which represents current, by the angle $\varphi$ which in this case is shown as approximately 30 degrees. In harmonic motion the angle passed over represents time elapsed.

This relation may be indicated in vectors or polar coordinates as is shown in Fig. 10, the line OE represents electro-motive force and the line OI represents current flow. It will be seen that the vector OI lags behind

BEST AVAILABLE COPY the vector OE by the angle $\varphi$. Taking the line OE as the base line and visualizing the expression for power above outlined, we may assume that the vector OI which represents current, is made up of the two components OX and XI; the component OX represents the in-phase or power component, while the vector XI represents the reactive or wattless component of current.

As it is desired to obtain an expression which represents the cosine of the angle $\phi$, means must be provided for evaluating the vectors OX and XI. This can be done by means of wattmeters as I shall describe later so that the angle $\phi$ may be properly determined and an indication or a record made thereof. In view of the fact that the angle depends upon the ratio only of the vectors OX and XI and is independent of the absolute value of the vectors, it is necessary in some manner to provide a common means which will indicate this ratio.

Consider the chart as shown in Fig. 11 and assume that the vector OE be laid out on this chart at the angle $\varphi$ with the base line OI. It will now be seen that any particular point on the line OE, such for instance as the point 3, falls within one of the small squares into which the chart is divided. To give the value of the cosine of the angle determined by the line OE with the base OI it is necessary only to place within the square, such as the square 4 within which the point 3 falls, the numerical value of the angle or of any of the functions pertaining to it, such, for instance as the cosine of said angle, the power component and the reactive component, or any other information.

While such marking of the individual squares is only approximate, it can be seen that theoretically if the squares are made small enough, any desired degree of accuracy may be obtained.

The charts of Figs. 7 and 8 are constructed on this theory and the operation of the same will be made clear from a consideration of the diagram of Fig. 1 or of Fig. 5[B].

In Fig. 1 I have indicated a single-phase transmission line 5 connected by the wires 6—7 with the customer's load 8, which may consist of any desired power consuming apparatus.

In order to determine the power factor of the load 8 I have provided the two wattmeter elements 10 and 11 suitably connected to the wires 6 and 7 to give indications of the power component and of the reactive component respectively. The wattmeter elements 10 and 11 are of the integrating or watt hour meter type, having the rotating elements 12 and 13 shown in dotted lines. The coils 14 and 15 are connected in series with the supply mains and the pressure coils 17 and 18 are suitably connected across the mains 6 and 7, the wattmeter element 11 being provided with the inductance 20 to provide a component operating at substantially 90 deg. to the electro-motive force in the coil 17 of the meter 10. I shall not describe the details of the wattmeters as the construction thereof is not my invention.

The rotatable elements 12 and 13 are provided with normally open contacts 21 and 22 which are closed at the completion of a revolution of the corresponding rotatable members or any part of a revolution thereof.

I provide an element, in this case the cylinder 23 having motion in two directions— namely in an axial or longitudinal direction and rotational respectively—these two motions being controlled by the wattmeter elements 10 and 11 respectively. The axial motion represents the components lying along the line OX in Fig. 10, and the rotational motion is represented by the components lying on the line XI in the same figure.

The cylinder 23 is mounted upon the shaft 24 and is provided with the lifting ratchet 25 and the rotating ratchet 26, by means of which this cylinder may be moved axially and rotatively respectively. The lifting ratchet 25 is provided with a holding pawl 27 and the rotary ratchet 26 is provided with a similar holding pawl 28. An actuating pawl member 29 operated by the solenoid 30 is controlled by the wattmeter element 10 to raise the cylinder 23 in step by step motion. The circuit for the solenoid 30 is formed as follows: from the battery or source of current 31 through the wire 32 the contact 21, wire 33, through the winding of the solenoid 30 and then back to battery over the wire 34. Thus for each closing of the contact 21 at the power wattmeter 10 the cylinder 23 will be advanced axially by one step. An operating solenoid 35 is controlled by the contact 22 over the following circuit. From the battery 31 over the wire 32, through the contact 22, wire 37 through the winding of the solenoid 35 and back to battery 31 over the wire 38.

It is thus apparent that the printing cylinder 23 is advanced one step rotatively for each closing of the contact 22 by the reactive wattmeter 11.

The holding pawls 27 and 28 respectively are controlled by the solenoids 39 and 40 respectively and these holding pawls are withdrawn periodically to reset the printing cylinder 23 for the beginning of the next period. In this connection it is to be noted that I provide a spring 41 of the spiral type at the lower end of the shaft 24 through the medium of a sleeve 42 which is keyed to the shaft 24, but which permits axial movement of the shaft with respect to said sleeve.

BEST AVAILABLE COPY

Thus when the solenoids 39 and 40 are energized to withdraw the holding pawls 27 and 28 respectively, the spring 41 moves the drum 23 back to its zero position with respect to motion of rotation and the weight of the drum and connected parts lowers the drum axially to its zero position with respect to axial motion.

The solenoids 39 and 40, which control the resetting are in turn controlled by a suitable time controlled contact shown in this case as mounted on the disk 43. The disk 43, as well as the disk 44, is suitably driven at a predetermined rate by time controlled mechanism, in this case illustrated by the clock 45. Thus whenever the contact between the brushes 46 and 47 is closed the printing cylinder 23 is reset.

I have provided means for periodically recording the position of the cylinder which determined its reading as by means of the record strip of paper 48, and this strip is fed from the supply roller 49 to the take-up roller 50. The feeding of this record strip is controlled by a solenoid 51 and suitable pawl and ratchet mechanism 52 to advance the strips immediately after the printing magnet 53 has been energized.

The printing magnet 53 and the paper feeding magnet 51 are in series and are controlled by the contact brush 54 and the rotary contact making disk 44 so that periodically the printing magnet 53 is energized to make a record of the reading of cylinder 23 and the feeding magnet 51 is energized to advance the paper after the printing operation. In the drawings, the feeding mechanism controlled by the magnet 51 is represented in the deenergized position of magnet 51. I have shown the contact disk 44 as provided with numerous contacts for making frequent records of the reading of the cylinder 23, but it is to be understood that only one printing operation may be performed for each period and that preferably at the end of the period just before the cylinder 23 is reset.

The printing magnet 53 is provided with a printing platen 55 which is of substantially the same size as the squares or rectangles provided on the cylinder 23 so that only the figure directly under the platen 55 will be printed upon the record strip 48. The platen 55 thus performs the function of a reference point for the cylinder 23. Fig. 7 shows a development of the surface of the cylinder 23. This is an exemplification only and is not the only manner in which the cylinder may be graduated. I have shown ten steps in each direction, but it is to be understood that the number of steps may be varied and preferably should be greatly increased.

Instead of employing two releasing magnets 39 and 40, a single magnet may serve to release both of the holding pawls 27 and 28. While a cylindrical drum is preferable for reducing the size of the apparatus, it is to be understood that a moving surface of any other character might be employed so long as this surface has a motion in two directions with respect to the reference point and is suitably graduated or inscribed to give the proper values.

Figure 5A:
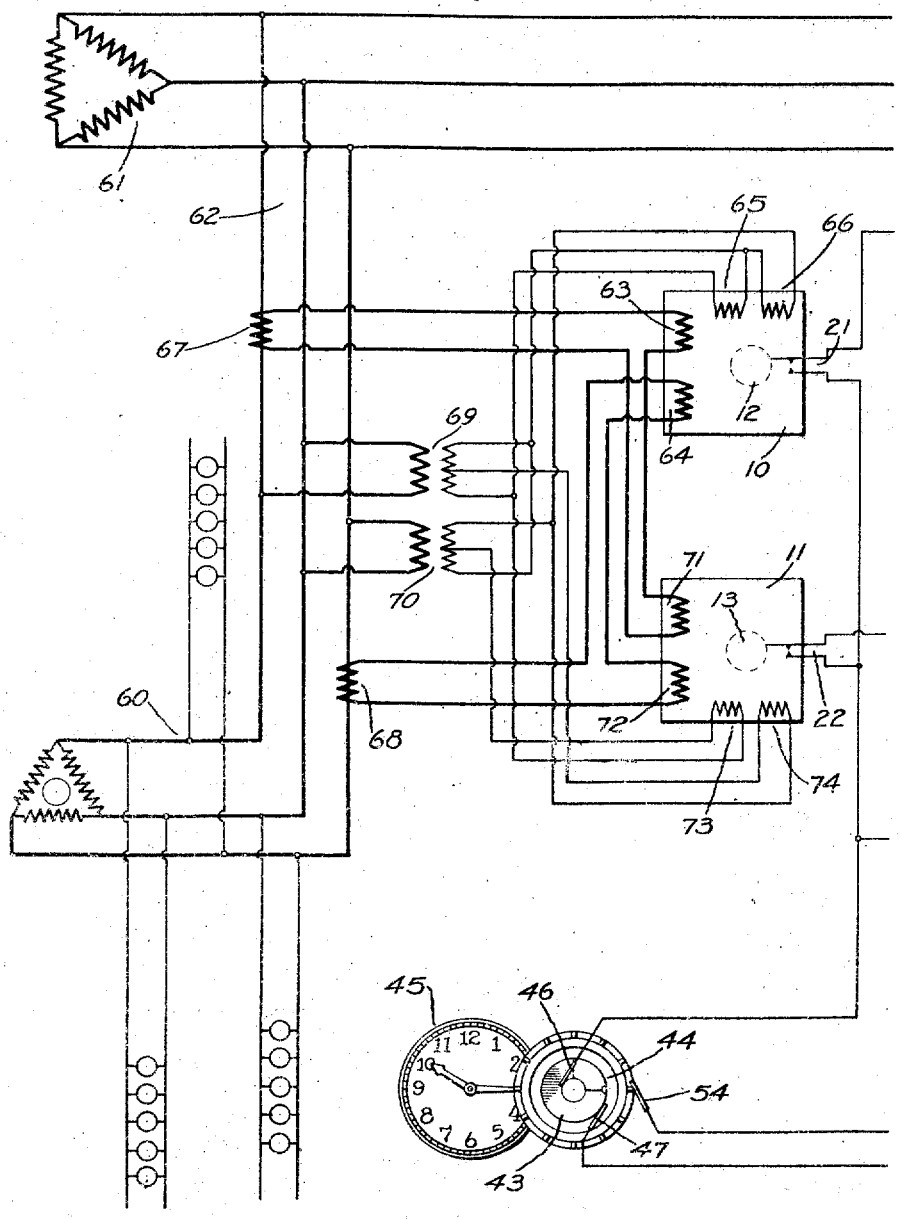

In Fig. 5A I have shown the manner of connecting the device of my invention to a 3-phase load circuit. In this case the 3-phase load 60 is connected to the mains 61 through the leads 62. The power wattmeter element 10 is provided with two current windings 63 and 64 respectively and two potential windings 65 and 66 respectively. These windings are connected in any well known manner to the leads 62 as by means of two current transformers 67 and 68 disposed in series relation to the two phases of the load 60 and the potential transformers 69 and 70 respectively connected across two of the phases of the load. The reactive meter 11 is provided with the two current coils 71 and 72 and with the two pressure coils 73 and 74 respectively. The current coils 71 and 72 are connected in series with the secondaries of the current transformers 67 and 68. The pressure coils are connected so as to receive only a component at right angles to flow of current.

Figure 5B:
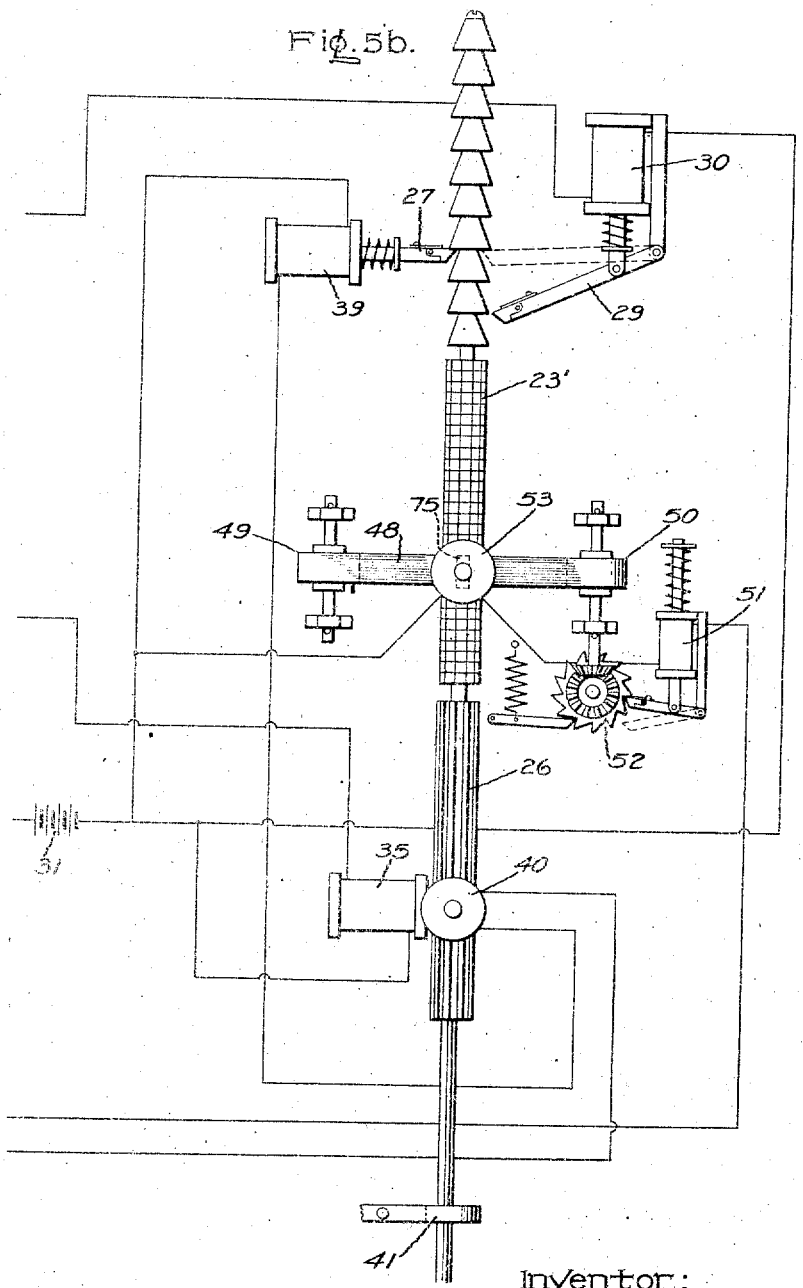

The cylinder 23′ shown in Fig. 5B is provided with indicating characters such as type for indicating and printing not only the power factor for the given periods but also the reactive component and the power component over said period. The surface of the cylinder 23′ is shown as developed in Fig. 8. It is apparent that a greater number of steps may be advantageously employed although the number of steps is not of the essence of the invention. The platen 75, which strikes the recording strip 48 against the type of the cylinder 23′ is made of the proper size to embrace the three small corresponding squares. Thus there are recorded side by side on the recording strip 48 the power component, the reactive component and the power factor over a given period. Otherwise the operation of the system shown in Figs. 5A and 5B is the same as that shown in Fig. 1.

If the steps in either a rotary or a vertical direction should be too great the last step may be provided with markings for indicating that the reading has gone beyond the dimensions of the chart.

In Fig. 6 I have illustrated the manner in which the pressure coils of the wattmeter elements may be connected to the mains to secure correct readings. The pressure coils of the power wattmeter element 10 are connected across two phases of the line, but the pressure coils of the reactive wattmeter 11

BEST AVAILABLE COPY are connected to the coils of the power transformer 77.

The particular manner of making the connections is not of importance and may be varied. Instead of connecting to the windings of the service transformers as indicated at 77, Fig. 6, an artificial load may be provided through which connection may be made.

In Fig. 12 I have indicated diagrammatically a modification of the form of device shown in Figs. 5A and 5B, in which totalizing counters for total power component and total reactive component are provided.

I have added the numeral wheels 80 and 130, upon which I inscribed characters suitable for printing, reading in terms of total power component or actual kilowatts, and in total reactive component respectively. The numeral wheels 80 are operated by the electro-magnet 82 in series with the vertical stepping magnet 30 so that for every operation of the vertical stepping magnet 30 another unit is added to the indication on the totalizer wheels 80, thereby registering continuously the increase in actual power consumed. In the same way the totalizer magnet 132 is in series with the rotary stepping magnet 35 and serves to accumulate or totalize the amount of reactive component over any given period.

I have also provided the printing magnets 83 and 131 which are connected in series with the printing magnet 53 and the paper advancing magnet 51. Otherwise the operation of this mechanism is substantially the same as that shown in Figs. 5A and 5B. It is assumed, of course, that the connection shown in Fig. 12 for the wattmeter elements 12 and 13 are provided so that the rotatable elements 12 and 13 are responsive to power components and reactive components respectively. Upon the completion of a revolution of the wattmeter element 12 the contact 21 will be closed for an instant and the vertical stepping magnet 30 and the cyclometer magnet 82 will be energized simultaneously, thereby actuating the indicating cylinder axially and stepping forward the unit cyclometer wheel 80 by one unit. In the same manner all the closures of the contacts 22 of the reactive meter will be totalized on the accumulator 130.

Figure 14A:
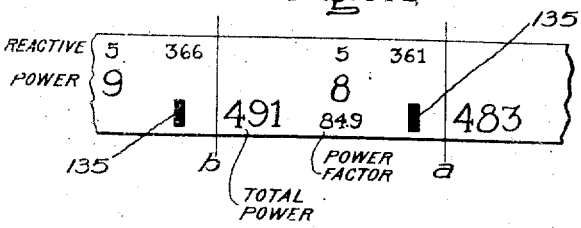
Figure 14B:
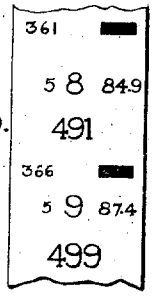

The record strip is shown in detail in Figs. 14, 14A and 14B. It is apparent that any one or more of the quantities may be omitted if desired and a record of the others made. At the end of a given period as controlled by the time controlled mechanism and contact mechanism governed thereby, the circuit for the paper advancing magnet 51 and for the printing magnets 53, 83 and 131 will be energized so that a record is made of the reactive component over a given period, the power component over said period, the power factor over the period and the total reactive component and the total kilowatts consumed to the end of that period. Thereafter the paper strip is advanced by the pitch distance illustrated between the dotted lines *a* and *b* in Figs. 14 and 14A.

This record is highly valuable as indicating not only the character of the load but the total load in kilowatts and the total reactive component over a given period. From the record strip thus made it is possible not only to read the power factor over any short period of time but also over any longer desired period of time. The total reactive component or part of the same over any particular period has a definite relation to the total power component or the part of the same extending over the given period. The cyclometer wheels 80 and 130 may be made so as to reset by any well known means, as is well understood by those skilled in the art.

The record strip made by each of the forms heretofore described, also has value in that it indicates the maximum demand and the nature of that maximum demand over any given period. In the record shown in Figs. 14, 14A and 14B there is given a direct indication of the amount of power consumed over a given period. By inspecting the record strip it will be possible to select the largest value of power component and this represents the maximum demand. It is also possible to select the largest value of reactive component and to compare its relation to the power component or to the power factor in determining the character of the load. Thus it is possible not only to select the largest value of power component over a unit period to represent maximum demand, but also to determine the power factor during such maximum demand.

I have shown the record strip in Figs. 14, 14A and 14B as bearing indications 135 to indicate the beginning or end of a period. This may be done by the platen of the printing magnet 83 or 130. Other useful indications such as an indication of time may be made on the record strip if desired.

The printing attachment for printing the total value of power consumed may be added to the form shown in Fig. 1 and in that case a record such as is shown in Fig. 13 will be provided. From this record it will be possible to find the maximum demand over any given period by a simple process of subtraction. Thus the largest difference represents maximum demand.

The values of power factor which appear within the squares of the charts, Figs. 7 and 8, may be mathematically determined as indicated in Fig. 15. Consider the point P at the center of the square as typical of all points within said square. This point P

BEST AVAILABLE COPY lies a horizontal distance of three steps away from the Y axis and lies a vertical distance of nine steps or units in a vertical distance away from the X axis. The tangent of the angle POX is therefore 9 divided by 3 or 3. The cosine of the angle whose tangent is 3 is .317. These charts (Figs. 7 and 8) are graduated along their X axes in values of power component and along their Y axis in values of reactive component.

The values may be otherwise determined by measuring the size of the angle and obtaining the value of the cosine of that angle from tables of trigonometric functions.

I have illustrated heretofore only rectangular coordinates, but it is to be understood that polar coordinates or a combination of both may be used.

Where an unbalanced three-phase system is connected the power factor indication will be an average of the three phases.

I do not intend to limit the invention to any particular form of apparatus other than as the same is specified in the following claims.

For the purposes of my invention it is immaterial whether the surface itself be moved or whether the reference point be moved with respect to the surface. Such embodiment of the invention is obviously intended to come within the scope of the appended claims. It is also apparent that a partial movement of the surface and a partial movement of the reference points may accomplish the same end; namely, that of bringing the proper indication or recording character into line with the reference points so that an exact reading and recording may be made.

I am aware that my invention includes a number of individually novel features in devices of this character which are useful whether the device which I have disclosed be used in its entirety or not, and I have therefore laid claim to the same as appears in the appended claims.

I claim:

1. The method of continuously indicating average power factor over a predetermined period of time, or any portion thereof, of the electrical power flowing in a conductor by means of a surface divided with respect to a zero point into unit areas by coordinates and provided with graduations on said unit areas in terms of power factor, the value of the graduation in each area being the cosine of the angle whose tangent is the ratio between the ordinate of said area and the coordinate of the same area, which comprises—integrating the instantaneous values of the power component of the power flowing in said line in said period, or any portion thereof into predetermined units, integrating the instantaneous values of the reactive component of the power flowing in said line in said period or any portion thereof into other predetermined units preferably of equal value with the units of power component, laying out said units of reactive component as they are completed lineally along an ordinate of measurement of said surface, laying out said units of power component as they are completed lineally along a coordinate of measurement of said surface, and determining at any time the value of power factor from the graduation of the unit area which is defined in terms of its ordinate by the value of the integrated or accumulated units of reactive component and in terms of its coordinate by the value of the integrated or accumulated units of power component.

2. In combination, an element having a surface with indications thereon corresponding to various power factors, means responsive to the power component of electrical energy flowing in a line and means responsive to the reactive component flowing in said line, both of said means cooperating with the element to move said surface to cause an indication to be given of the power factor of the electrical power flowing through said line.

3. In combination, means adapted to be responsive to reactive components of power flowing in a line, means responsive to the power components flowing in said line, a third means comprising an indicating surface graduated in accordance with the angle of lag, the tangent of which is defined by the ratio of the reactive component to the power component, which surface is influenced by said first two means to give an indication of power factor.

4. In combination, means adapted to be responsive to reactive component of power flowing in a line, means responsive to the power component flowing in said line, a third means comprising an indicating surface influenced by said first two means to give an indication of power factor and means for periodically recording the reading of said indicating surface.

5. In combination a line, an element having an indicating surface bearing indications corresponding to cosines of various angles, a first electrical means responsive to the integrated reactive component in said line, a second electrical means responsive to the integrated power component in said line, means for selecting a particular indication on said surface, said element being adapted to be brought into register with said latter means by said joint action of the first end of the second electrical means to select thereby the cosine of the angle whose tangent is the ratio of the integrated reactive component to the integrated power component.

BEST AVAILABLE COPY

6. In combination a line, an element having an indicating surface bearing indications corresponding to cosines of various angles, a first electrical means responsive to the reactive component in said line, a second electrical means responsive to the power component in said line, means for selecting a particular indication on said surface, said element being adapted to be brought into registry with said latter means by joint action of the first and of the second electrical means to select thereby the cosine of the angle whose tangent is the ratio of the reactive component to the power component, and means for periodically making a record of the indication selected on said indicating surface.

7. In combination a line, an element having a surface provided with indications corresponding to power factors, means subject to the reactive component in said line for moving said surface in one direction only, means subject to the power component in said line for moving said surface in another direction only to bring a corresponding indication on said surface into register with a predetermined reference position.

8. In combination a line, an element having a surface provided with indications corresponding to power factors, means subject to the reactive component in said line for moving said surface in one direction only, means subject to the power component in said line for moving said surface in another direction only to bring a corresponding indication on said surface into register with a predetermined reference position, and means for making a record periodically of the indication so brought into register.

9. In combination a line, an element having a surface provided with indications corresponding to power factors, means subject to the reactive component in said line for moving said surface in one direction only, means subject to the power component in said line for moving said surface in another direction only to bring a corresponding indication on said surface into register with a predetermined reference position, and means for making a record periodically of the indication so brought into register, and means for periodically setting said indicating surface back to the zero position.

10. In combination a line, a first integrating wattmeter element responsive to the reactive component in said line, a second integrating wattmeter element responsive to the power component in said line, means responsive solely to said first wattmeter element for producing movement in a given direction, and means responsive solely to said second wattmeter element for producing movement in a direction substantially at right angles to the movement produced by said first wattmeter element, and means cooperating therewith to record the amount of said movements during each of a number of predetermined time intervals.

11. In combination a line, a first integrating wattmeter element responsive to reactive component in said line over a given period, a second integrating wattmeter element responsive to power component in said line over the same period, a common indicating element, means responsive to the first wattmeter element and means responsive to said second wattmeter element both of said latter means cooperating with said common indicating element to give an indication of power factor over a given period.

12. In combination a line, a first wattmeter element responsive to reactive component in said line, a second wattmeter element responsive to power component in said line, a common indicating element, means responsive to the first wattmeter element and means responsive to said second wattmeter element, both of said latter means cooperating with said common indicating element to give an indication of power factor and reactive component over a given period, said common indicating element being graduated in terms of power factor and reactive component.

13. In combination a line, a first integrating wattmeter element responsive to reactive component flowing in said line over a given period, a second integrating wattmeter element responsive to power component in said line over the same period, a common indicating element, means responsive to the first wattmeter element and means responsive to said second wattmeter element, both of said latter means cooperating with said common indicating element to give an indication of power factor and reactive component over said given period, said indicating element being graduated in terms of power factor and reactive component.

14. In combination a line, an integrating wattmeter element responsive to reactive component in said line, a second integrating wattmeter element responsive to power component in said line, a common indicating element, said indicating element being graduated in terms of power factor and of power component, means responsive to the first wattmeter element and means responsive to said second wattmeter element, both of said latter means cooperating with said common indicating element to give an indication of power factor and of power component during a predetermined interval, and means for recording said indications.

15. In combination a line, a first integrating wattmeter element responsive to reactive component in said line, a second integrating wattmeter element responsive to power component in said line over the same

BEST AVAILABLE COPY period, a common indicating element graduated in terms of power factor and power component, means responsive to the first wattmeter element and means responsive to said second wattmeter element, both of said latter means cooperating with said common indicating element to give an indication of power factor and of power component over said given period.

16. In combination a line, a first integrating wattmeter element responsive to reactive component in said line, a second integrating wattmeter element responsive to power component in said line, a common indicating element graduated in terms of power factor, reactive component and power component, means responsive to the first wattmeter element and means responsive to said second wattmeter element, both of said latter means cooperating with said common indicating elements to give an indication of power factor, reactive component and power component during a predetermined interval.

17. In combination, a line, an indicating element comprising a surface having graduations distributed thereupon in two dimensions in terms of the functions of two variables similar to the character of the load connected to said line, a meter element responsive to one of the line variables, contact means controlled by said meter elements, a second meter element responsive to the other of said line variables, contact means controlled by said second meter element, a reference member cooperating with said indicating element, means for securing relative movement between said surface and said reference member in one dimension in steps corresponding to the operation of said contact means, and means for securing relative movement between said surface and said reference member in another dimension in steps corresponding to the operation of said second contact means.

18. In combination a line, an integrating wattmeter element responsive to the power flowing in said line, contact means controlled by said element, an indicating and recording element comprising a drum having graduations in two dimensions adapted to make a record, means for advancing the indicating element in one dimension in steps corresponding to the operation of said contact means a complete graduation at a time, means for moving the drum in another dimension and automatic recording means for periodically making a record of the reading of said last element.

19. In combination a line, an integrating wattmeter element responsive to the power flowing in said line, contact means controlled by said element, an indicating and recording element having graduations in two dimesions and being adapted to make a record, means for advancing the indicating element in one dimension in steps corresponding to the operation of said contact means, means for advancing the element in the other dimension and automatic recording means for periodically making a record of the reading of said last element, and automatic means for periodically resetting the indicating and recording element.

20. In combination a line, means controlled by the power component of power flowing through the line, means controlled by the reactive component of power flowing through said line, a surface having graduations in one direction corresponding to the power component and having graduations in another direction corresponding to reactive components and having figures lying substantially at the intersections of said graduations, said figures corresponding to a function of the angle of phase difference between electro-motive force and current in the line, a relatively stationary indicating or reference member, means controlled by said first means to move the surface in said first direction and means controlled by said second mentioned means to move the surface in said second direction.

21. In combination a line, means responsive to the power component of power flowing through the line, means responsive to the reactive component of power flowing through said line, a surface having graduations in one direction corresponding to the power component and having graduations in another direction corresponding to reactive component and having figures lying substantially at the intesections of said graduations, said figures corresponding to a function of the angle of phase difference between electro-motive force and current in the line, a relatively stationary indicating or reference member, means controlled by said first means to move the surface in said first direction and means controlled by said second mentioned means to move the surface in said second direction, and means for periodically making a record of the figure brought into register with the relatively stationary member.

22. In combination a chart movable in two directions, said chart being graduated in one direction in terms of reactive component and in another direction in terms of power component relatively stationary reference means adjacent said movable chart, means adapted to be responsive to reactive component in a line for moving the chart in said first direction, means adapted to be responsive to the power component in the same line, for moving the chart in the second direction to bring a predetermined portion of the chart corresponding to the power factor in register with said stationary reference means.

23. In combination a chart movable in

BEST AVAILABLE COP' two directions, said chart being graduated in one direction in terms of reactive component, and in another direction in terms of power component, indicating characters at the intersections of said graduations, a relatively stationary reference means, means responsive to reactive component in a line for moving the chart in said first direction, means responsive to the power component in the line for moving the chart in a second direction to bring a character of the chart corresponding to the angle of phase difference in register with said stationary reference means.

24. In combination a chart movable in two directions, said chart being graduated in one direction in terms of reactive component, and in another direction in terms of power component, indicating characters at the intersections of said graduations, a relatively stationary reference means, means responsive to reactive component in a line for moving the chart in said first direction, means responsive to the power component in the line for moving the chart in a second direction to bring a character of the chart corresponding to the angle of phase difference in register with said stationary reference means, and means for making a record periodically of the character brought into register with said reference means.

25. In combination a chart movable in two directions, said chart being graduated in one direction in terms of reactive component, and in another direction in terms of power component, indicating characters at the intersections of said graduations, a relatively stationary reference means, means responsive to reactive component in a line for moving the chart in said first direction, means responsive to the power components in the line for moving the chart in a second direction to bring a character of the chart corresponding to the angle of phase difference in register with said stationary reference means, and means for making a record periodically of the character brought into register with said reference means, and means for periodically resetting the chart to the zero position in both directions.

26. In a device of the character described, a wattmeter adapted to be responsive to reactive component flowing in a line, a second wattmeter element adapted to be responsive to power component in said line, indicating means controlled jointly by said wattmeter elements, means for moving the indicating means in one direction in response to one of said wattmeter elements, other means responsive to the other of said wattmeter elements for moving the indicating means in another direction, said indicating means having characters thereupon and relatively stationary reference means adapted to be brought into register with a specific one of said characters to indicate the power factor of the current flowing through the line.

27. In combination, a wattmeter element responsive to reactive component in a line, a second wattmeter element responsive to power component in a line, indicating means comprising a cylinder having graduations corresponding to power factors upon the surface thereof, stepping means responsive to one of said wattmeter elements for moving the cylinder axially and stepping means responsive to the other of said wattmeter elements for moving said cylinder rotarily, and a stationary reference member with which a portion of said cylinder is adapted to be brought into register for indicating power factor.

28. In combination, a wattmeter element responsive to reactive component in a line, a second wattmeter element responsive to power component in a line indicating means comprising a cylinder having graduations corresponding to power factors upon the surface thereof, stepping means responsive to one of said wattmeter elements for moving the cylinder axially and stepping means responsive to the other of said wattmeter elements for moving said cylinder rotarily, and a stationary reference member with which a portion of said cylinder is adapted to be brought into register for indicating power factor, and printing means for periodically making a record of the portion of said cylinder brought into register with the relatively stationary means.

29. In combination, a wattmeter element responsive to reactive component in a line, a second wattmeter element responsive to power component in a line indicating means comprising a cylinder having graduations corresponding to power factors upon the surface thereof, stepping means responsive to one of said wattmeter elements for moving the cylinder axially and setting means responsive to the other of said wattmeter elements for moving said cylinder rotarily, and a stationary reference member with which a portion of said cylinder is adapted to be brought into register for indicating power factor, and printing means for periodically making a record of the portion of said cylinder brought into register with the relatively stationary means, and automatic resetting means for periodically resetting the cylinder both axially and rotarily.

30. In combination an integrating wattmeter for power component, an integrating wattmeter for reactive component and temporary register means for registering the power component and the reactive component measured by said wattmeters over a

BEST AVAILABLE COPY given period and for registering the power factor corresponding to said values of power component and reactive components.

31. In combination an integrating wattmeter for power component, an integrating wattmeter for reactive component and a temporary register for registering the power component and the reactive component measured by said wattmeters over a given period.

32. In combination an integrating wattmeter for power component, an integrating wattmeter for reactive component, temporary register means for registering the power component and the reactive component measured by said wattmeters over a given period, means for periodically recording the readings of said registering means and means for periodically resetting the registering means.

33. In combination an integrating wattmeter element for power component, an integrating wattmeter element for reactive component, temporary register means for registering the power component and the reactive component measured by said wattmeters over a given period, and an accumulating register for registering the total amount of power component.

34. In combination an integrating wattmeter element for power component, an integrating wattmeter element for reactive component, temporary register means for registering the power component and the reactive component measured by said wattmeters over a given period, an accumulating register for registering the total amount of power component, a record sheet and means for periodically recording on said sheet the readings of the temporary register and the accumulating register.

35. In combination an integrating wattmeter element for power component, an integrating wattmeter element for reactive component, temporary register means for registering the power component and the reactive component registered by said wattmeters over a given period and for registering the power factor corresponding to said values of power component and reactive component over said period, means for resetting periodically the temporary register means, an accumulating register for registering the total amount of power component, a record sheet and means for periodically recording on said sheet the readings of the temporary register and of the accumulating register.

36. In a device of the character described, a rectangular chart subdivided over its entire area into a plurality of unit areas defined by two groups of continuous lines which intersect each other, said areas having inscriptions thereupon of power factors, the value of each inscription being a trigonometric relation of the value of the position of the particular unit area along one group of lines to the value of the position of said area along the other group of lines, and means responsive to power flowing in a line for bringing the reference member and the particular unit area which has the proper inscription of power factor into register to indicate the power factor of the power flowing in the line, said last means being subject to two forces corresponding to the two sets of lines, namely power component and reactive component.

37. In combination, an integrating wattmeter for power component arranged to produce a movement in one direction, an integrating wattmeter for reactive component arranged to produce a movement in a different direction, and a temporary register influenced by said movements for registering the power component and the reactive component measured by said wattmeters over a given period.

38. In combination, an integrating wattmeter for power component, an integrating wattmeter for reactive component, and means for effecting simultaneous movements of a common registering element in two different directions, corresponding to the integrated measurements of said wattmeters over a given period.

39. In combination, means adapted to be responsive to the integrated reactive component of power flowing in a line, means adapted to be responsive to the integrated power component flowing in said line, a third means comprising an indicating surface graduated in two dimensions in accordance with the power factor of the energy flowing in the line, and means cooperating with said graduated surface and adapted to be brought into register with the proper graduation on said surface by relative movement between the surface and said last means to indicate power factor.

40. In combination, an indicating element comprising a drum having its cylindrical surface graduated in two dimensions, means responsive to power component for moving the drum in one dimension and means responsive to reactive component for moving the drum in the other dimension, and indicating means adapted to cooperate with the drum and to be brought into register with the particular portion of the surface of the drum which indicates the power factor corresponding to said component.

41. In combination, an integrating meter responsive to a function of the power component flowing in a conductor, a second integrating meter responsive to a function of the reactive component flowing in the conductor, a chart graduated in two dimensions in terms of a function of the two

BEST AVAILABLE COP' components and reference means for selecting an indication on the chart, said reference means and said chart being relatively movable with respect to each other by the joint action of the two meters to select the corresponding function.

42. In a device of the class described, a printing drum, a meter responsive to a characteristic of the current flowing in a conductor, said drum being graduated in two dimensions and movable in two dimensions, means controlled by said meter for moving the drum in one dimension and other means for moving the drum in another dimension.

43. In a meter of the character described, a two dimensional chart having its surface subdivided into unit areas, each of said unit areas having inscribed thereupon a function of the angular position of the area with respect to a zero position, electrical means for measuring two components or factors of electrical power, a reference member and means subject to one of said components for registering its quantitative value in one dimension on said chart by relative movement of the chart with respect to the reference member, and means subject to the other component for registering its quantitative value in the other dimension on said chart by relative movement of the chart with respect to the reference member.

44. In combination a line adapted to have a flow of electrical power therethrough, said flow of power being characterized by two variables, a chart or indicating member graduated in two dimensions in functions of the two variables; means cooperating with the chart or indicating member to indicate continuously a desired function of said two variables, a device responsive to unit quantities of one of said variables for controlling in one dimension the selection of the proper graduation on said chart or indicating member, and a second device responsive to unit quantities of the other of said variables for controlling in another dimension the selection of the proper graduation on said chart or indicating member, said device jointly effecting selection of the proper graduation to indicate the function of the two variables as measured in units by said devices.

45. The method of measuring and indicating a desired characteristic of an electric flow of current with a surface graduated in two dimensions from a zero point in terms of said characteristic and a reference member, which comprises, summing up or integrating the instantaneous values of the reactive component into units of predetermined value, and when a unit is completed moving the surface and the member relatively to each other in response thereto a unitary amount in a given direction with reference to the zero position, simultaneously summing up or integrating the instantaneous values of the power component into corresponding units of the predetermined value and when a unit of the latter class is completed moving the surface and the member relatively to each other in response thereto a unitary amount in a direction at substantially right angles to the first given direction with reference to the zero position, whereby said reference member and said chart at any time designate the desired characteristic of the circuit for any period of time considered.

46. The method of measuring and indicating a desired characteristic of an electric flow of current with a surface graduated in two dimensions from a zero point in terms of said characteristic and a reference member, which comprises, summing up or integrating the instantaneous values of the reactive component into units of a predetermined value, and when a unit is completed moving the surface and the member relatively to each other in response thereto a unitary amount in a given direction with reference to the zero position simultaneously summing up or integrating the instantaneous values of the power component into corresponding units of the predetermined value and when a unit of the latter class is completed moving the surface and the member relatively to each other in response thereto a unitary amount in a direction at substantially right angles to the first given direction with reference to the zero position, whereby said reference member and said chart at any time designate the desired characteristic of the circuit for any period of time considered, and periodically restoring the surface and the member to zero position.

47. In combination, a line, an indicating element comprising a surface having graduations distributed thereon in two dimensions in terms of a trigonometric function of two variables controlled by the character of the load connected to said line, a first integrating wattmeter element responsive to one of the variables, a second integrating wattmeter element responsive to the other of said variables, a reference member cooperating with said indicating element, means responsive to the first wattmeter element for moving said surface with respect to said reference member in one direction, and means responsive to the second wattmeter element for moving said surface with respect to said reference member in another direction.

48. In combination, an element having a surface with indications thereupon corresponding to a desired trigonometric function of two variables, means responsive to the integrated power component of electrical energy flowing in a line and means respon-

BEST AVAILABLE COPY sive to the integrated reactive component flowing in said line, both of said means co-operating with the element to cause an indication to be given of the desired trigonometric function of said two components over a given interval.

49. In combination, means adapted to be responsive to the reactive component of power flowing in a line, means rsponsive to the power component flowing in said line, a third means comprising an indicatng surface graduated in accordance with a predetermined trigonometric function of two variables corresponding to said reactive component and power component, said third means being influenced by the first two means to give an indication of the desired trigonometric function of the two components.

50. In combination, means adapted to be responsive to reactive component of power flowing in a line, means responsive to the power component flowing in said line, a third means comprising an indicating surface influenced by said first two means to give an indication of a trigonometric function of the two components, and means for periodically recording the reading of said indicating surface.

51. In combination, a line, an element having an indicating surface bearing indications corresponding to a trigonometric function of two variable components lying at right angles to each other, a first electrical means responsive to the integrated reactive component in said line, a second electrical means responsive to the integrated power component in the line, means for selecting a particular indication on said surface, said latter means and said element being adapted to be brought into register by joint action of the first and of the second electrical means to select thereby the particular value of the trigonometric function of the said two variables.

52. In combination, a line, an element having a surface provided with indications corresponding to a trigonometric function of two variable components lying at right angles to each other, means subject to the reactive component in said line for moving said surface in one direction only, means subject to the power component in said line for moving said surface in another direction only to bring a corresponding indication on said surface into register with a predetermined reference position.

53. In combination, a line, an element having a surface provided with indications corresponding to a trigonometric function of two variable components lying at right angles to each other, means subject to the reactive component in said line for moving said surface in one direction only, means subject to the power component in said line for moving said surface in another direction only to bring a corresponding indication on said surface into register with a predetermined reference position, and means for making a record periodically of the indications so brought into register.

54. In combination, a line, an element having a surface provided with indications corresponding to a trigonometric function of two variable components lying at right angles to each other, means subject to the reactive component in said line for moving said surface in one direction only, means subject to the power component in said line for moving said surface in another direction only to bring a corresponding indication on said surface into register with a predetermined reference position, means for making a record periodically of the indications so brought into register, and means for periodically setting said indicating surface back to the zero position.

55. In a device of the class described, a cylindrical drum, the surface of the drum having a zero point and being graduated in two dimensions to form rectangular unit areas, said unit areas having printing characters thereupon, each character being a trigonometric function of the location of the unit area with respect to the zero point.

56. In a device of the class described, the combination of a cylindrical drum, the surface of which has a zero point and which is graduated in two dimensions to form unit areas, said unit areas having printing characters thereupon, each character being a trigonometric function of the location of the unit area with respect to the zero point in terms of suitable units, said drum being mounted for axial and rotary movement, stepping means for moving the drum in suitable unit steps in an axial direction stepping means for moving the drum in unit steps in a rotary direction, holding means for holding the drum in advanced position and means for releasing said holding means.

57. In a device of the class described, the combination of a cylindrical drum, the surface of which has a zero point and which is graduated in two dimensions to form unit areas, said unit areas having printing characters thereupon, each character being a trigonometric function of the location of the unit area with respect to the zero point in terms of suitable units, said drum being mounted for axial and rotary movement, stepping means for moving the drum in suitable unit steps in an axial direction, stepping means for moving the drum in unit steps in a rotary direction, holding means for holding the drum in advanced position, means for releasing said holding means at the end of a given period of time and means for printing the selected one of

BEST AVAILABLE COPY said characters at the end of the given period.

58. The method of indicating the character of power flowing in a line over a predetermined period of time, which comprises integrating the instantaneous values of power component over said period into predetermined units; simultaneously integrating the instantaneous values of reactive component over said period into similar predetermined units; laying out said units in direction and dimensions from a zero position as they are completed by the movement of a common indicating element with reference to a given zero position, and at the end of the period ascertaining a desired trigonometric function of the position of said common indicating element with respect to said zero position.

59. The method of indicating average power factor in a line over a predetermined period of time which comprises integrating the instantaneous values of power component over said period into predetermined units, simultaneously integrating the instantaneous values of reactive component over said period into similar predetermined units, moving a common indicating element in one direction with reference to a given zero position in response to the predetermined units of one component, and moving the indicating element in a direction at substantially right angle to the first direction of movement in response to the units of the second component, and at the end of the period, ascertaining the angular position of said common indicating element with respect to said zero position, in terms of the cosine of the angle.

In witness whereof I have hereunto set my hand this 17th day of April, 1923.

RUDOLPH F. SCHUCHARDT.